（12）United States Patent
Kasanyal et al.

(10) Patent No.: US 7,348,802 B2
(45) Date of Patent: Mar. 25, 2008

(54) DIFFERENTIAL RECEIVER

(75) Inventors: Sunil C. Kasanyal, Uttaranchal (IN); Rajat Chauhan, Uttaranchal (IN)

(73) Assignee: STMicroelectronics Pvt. Ltd., Noida (IN)

( * ) Notice: Subject to any disclaimer, the term of this patent is extended or adjusted under 35 U.S.C. 154(b) by 116 days.

(21) Appl. No.: 11/152,822

(22) Filed: Jun. 14, 2005

(65) Prior Publication Data

US 2006/0017463 A1   Jan. 26, 2006

(30) Foreign Application Priority Data

Jun. 15, 2004   (IN)   .......................... 1133/DEL/2004

(51) Int. Cl.
*H03K 19/0175*   (2006.01)
(52) U.S. Cl. .............................. 326/82; 326/68; 326/26
(58) Field of Classification Search ................. 326/82, 326/83, 86, 68
See application file for complete search history.

(56) References Cited

U.S. PATENT DOCUMENTS

| | | | | |
|---|---|---|---|---|
| 5,451,898 A | * | 9/1995 | Johnson | 327/563 |
| 5,796,281 A | | 8/1998 | Saeki et al. | |
| 5,945,852 A | * | 8/1999 | Kosiec | 327/68 |
| 6,411,146 B1 | * | 6/2002 | Kuo | 327/198 |
| 6,492,836 B2 | * | 12/2002 | Kiehl | 326/83 |
| 6,788,116 B1 | * | 9/2004 | Cook et al. | 327/108 |
| 6,831,504 B1 | * | 12/2004 | Holloway et al. | 327/541 |
| 7,061,273 B2 | * | 6/2006 | Wang et al. | 326/86 |

* cited by examiner

*Primary Examiner*—Rexford Barnie
*Assistant Examiner*—Crystal L Hammond
(74) *Attorney, Agent, or Firm*—Gardere Wynne Sewell LLP

(57) ABSTRACT

A differential receiver includes a feedback circuit connected between an output node and one common node of the differential receiver to reduce the bandwidth and reject noise for a specific interval of time. In operation, a differential receiver bias current is controlled responsive to an output signal at the output node. Bias current is turned on during a steady-state mode with respect to the output signal, and is turned off, for a given delay period, in response to a transition mode with respect to the output signal.

22 Claims, 11 Drawing Sheets

Figure 1: (Prior Art)

DIFFERENTIAL RECEIVER

PRIORITY CLAIM

The present application claims priority from Indian Patent Application No. 1133/Del/2004 filed Jun. 15, 2004, the disclosure of which is hereby incorporated by reference.

BACKGROUND OF THE INVENTION

1. Technical Field of the Invention

The present invention relates to an improved differential receiver.

2. Description of Related Art

Techniques have been developed for facilitating high-speed electrical communication over buses. High-speed communication uses low voltage swing signals that require a differential signaling technique.

To support differential signaling in integrated circuits (IC's), the circuit is designed to convert internal full swing signals to external low voltage differential signals and external low voltage differential signals to core acceptable signals. Generally differential receivers are used to accept external low voltage swing differential signals, but some noise is induced in the differential receivers at the time of reception that leads to power dissipation in the circuit.

FIG. 1 shows a circuit schematic of a conventional differential receiver circuit used in differential signaling applications. In FIG. 1, N11 and N12 are input NMOS transistors having their gates connected to differential input pads PAD and PADbar. PMOSs P11 and P12 are load transistors. NMOSs N13 and N14 and resistor R11 form a current sink.

The operation the differential amplifier is not explained herein. Details of one such differential amplifier is explained in book "CMOS Circuit Design, Layout and Simulations" by R. Jacob Baker, Harry W. Li and David E. Boyce.

In the schematic, reference 100 is not a part of the differential receiver, but represents an electrical parasitic appearing between I/O pads and I/O pins due to packaging. RT is a terminating resistor placed outside the device. It is shown here just for reference.

To get a good high-speed performance, the differential receiver shown is generally provided with high current, high gain and high bandwidth. But such a receiver will introduce propagation of noise and glitches because the receiver is so fast that even a small and short time disturbance at the input is amplified and presented at the output. So the main problem with the differential receiver shown is its noise susceptibility.

The majority of the noise problem comes at the time of transition of differential signals. As the operating frequencies of digital electronic devices increases, the signal lines used to route signals between components begin to behave like transmission lines because of the faster edge rates of the signals. If the impedance of the transmission line and the receiver are not matched, a portion of the incoming signal is reflected back. Reflections cause distortion in the received signal, which may lead to false interpretation of the logical value of the incoming signal.

In case of differential input signals, as the transitions are in opposite direction, noise due to reflections is also in opposite directions. That is, if one line of the differential pair is having a noise overshoot, the other line will have an undershoot at the same time. So, in this case noise on the differential pair is differential in nature instead of common mode noise. If sufficiently large, this differential noise is easily accepted by the differential receiver.

FIG. 2 shows HSpice post-layout simulation results of the prior art receiver in FIG. 1 with package parasitic 100 (package stub). (Here parameters of package parasitic are considered for typical BGA package with L=4.5 nH, R=0.45 ohm, C=1.45 pf). In FIG. 2, IN and INbar are the differential input signals applied having time period of 4 ns and signal swing of 0.4V. PAD and PADbar are the actual input waveforms looked by the differential receiver. OUT1 is the output of the differential receiver. It can be seen that the noise is differential in nature instead of being common mode and because of this, there are glitches on output signal OUT1.

A resistive "termination" technique is often applied to reduce signal reflections. One of the resistive "termination" techniques used for differential signals is shown in FIG. 1. Here a terminating resistor RT is placed external to the IC, between the differential lines. But the external termination does not take into consideration the package stub 100. The package stub 100 may cause the external input signals IN/INbar to ring and thus the actual input signal looked by the receiver at nodes PAD/PADbar is distorted.

FIG. 3 shows the simulation results of FIG. 1, with noisy input at PAD and PAD bar. Output OUT1 shows a glitch, due to the noise at the input of receiver.

One solution to this can be provided by using on-chip termination instead of external termination. Here termination resistor RT is provided between PAD and PADbar. Signal quality is improved by the on-chip resistor due to removal of the 'package stub' 100. But on-chip termination would be undesirable in multi-point and multi-drop configurations of data transmission.

A second solution is adding a Schmitt trigger at the input thus introducing DC hysteresis. To add hysteresis characteristics in input receivers, the ranges of low and high level input voltages are changed depending upon the direction of transition in the input signal. Generally adding hysteresis increase the receiver delays and therefore degrades the performance in high-speed I/O operations.

FIG. 4 shows a prior art differential receiver with hysteresis as suggested in U.S. Pat. No: 5,796,281. The architecture of the receiver of FIG. 4 is the same as that of FIG. 1 except that NMOS N3 is used to provide hysteresis. The gate of N3 is connected to the output OUT1. Here the sizes of N11 and N12 are not same. Resistance offered by N11 in parallel with N3 (when OUT1 is at logic high, means N3 is on) should be equal to the resistance offered by N12. So the size of N11 is smaller than that of N12. When IN1=0, IN2=1, OUT1=0, transistor N3 is off. When IN1 rises from 0 to 1 and IN2 falls from 1 to 0, current starts flowing through N11, and hence through P11, which mirrors same current to P12. Current flowing through P12 charges the load at OUT1. Since the size of N11 in FIG. 4 is smaller than the size of N11 in FIG. 1, it reduces the charging current of the load, hence increase the rising delay.

When IN1=1, IN2=0, OUT1=1, transistor N3 is on. When IN1 falls from 1 to 0, conduction of N11 decreases and conduction of N12 increases. Load at OUT1 discharges through N12. In FIG. 1, when IN1 starts falling from 1 to 0, voltage at net1 increases, hence turns P12 off. But in FIG. 4, an increment in voltage level of net1 is slower because of the transistor N3 that is on. So the discharging of load at OUT1 will be slower as compared to the case of FIG. 1.

FIGURES and 6 show the dc analysis and transient analysis results of FIG. 4 that depict an increase in the propagation delay of the receiver of the prior art.

So, the receiver with hysteresis increases the noise immunity but sufficiently increases the delays, which restricts the high frequency operation of receiver.

Therefore, there is a need for a circuit with improved noise protection for differential signaling applications as in a differential receiver, while providing minimized power dissipation.

SUMMARY OF THE INVENTION

Embodiments of the present invention provide an improved differential receiver having noise protection. Feedback control circuitry for the differential receiver functions to reduce bandwidth and current in the differential receiver. The receiver further provides minimum power dissipation by noise protection.

An embodiment of the improved differential receiver comprises a feedback circuit connected between an output node and one common node of the differential receiver to reduce the bandwidth and reject noise for a specific interval of time. The feedback circuit comprises a pulse generator circuit whose output is connected to a control bias current circuit and to a current mirror circuit in series. The pulse generator circuit may comprise a delay element and an Ex-OR gate, and the output of said delay element is connected to the input of said Ex-OR gate.

The Ex-OR gate may comprise an inverter.

The delay element may comprise a chain of inverters or a complex delay circuitry.

The control bias current circuit may comprise at least one transistor powered by a higher voltage supply.

The current mirror circuit may comprise at least two transistors connected to each other at their control nodes. The transistors may comprise P-MOS or N-MOS transistors.

An embodiment of the present invention further provides a method for rejecting noise signals by differential receiver comprising detecting an input signal by the differential receiver and outputting a response from the differential receiver to a feedback circuit for reducing the current flowing through the differential receiver and thereby reducing the bandwidth of the differential receiver to reject noise for a specific interval of time. This accordingly provides an improved differential receiver that minimizes power dissipation by reducing noise.

In accordance with an embodiment of the invention, a differential receiver comprises a pair of differential input transistors coupled at a common node and whose gates receive a differential input signal and a pair of load transistors coupled to the pair of differential input transistors to form at least one output node. A current sink circuit is coupled to the common node of the pair of differential input transistors, and a feedback circuit is coupled between the output node and the current sink circuit.

In accordance with another embodiment, a method comprises differentially receiving a signal to generate an output signal, and controlling differential receiver bias current responsive to the output signal.

BRIEF DESCRIPTION OF THE DRAWINGS

A more complete understanding of the method and apparatus of the present invention may be acquired by reference to the following Detailed Description when taken in conjunction with the accompanying Drawings wherein.

DETAILED DESCRIPTION OF THE DRAWINGS

Figure 7:
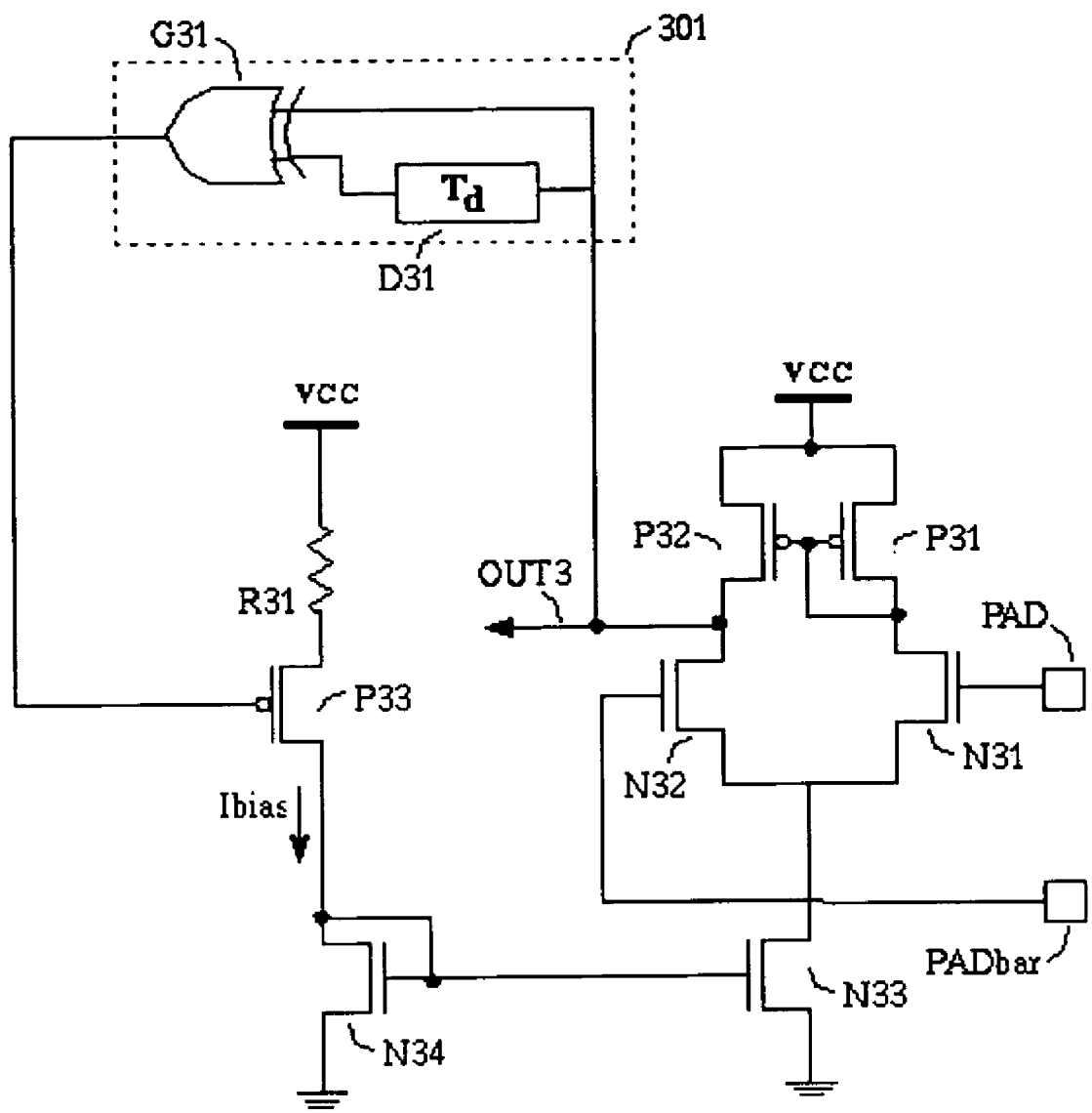
FIG. 7 illustrates the circuit diagram of a differential receiver according to an embodiment of the present invention.

FIG. 7 shows a circuit diagram of a differential receiver according to an embodiment of the present invention. The differential receiver shown here differs from the prior art in the way that it uses a feedback control circuitry for generating Ibias. The rest of the circuitry is similar to the prior art discussed above. Output OUT3 of the differential receiver is fed to an edge triggered pulse generator 301. The output of the generator 301 controls the gate of PMOS P33, which in turn controls the current Ibias of the current mirror circuitry. The edge triggered pulse generator 301 has a delay element D31, providing delay of time 'Td' and an EX-OR gate G31. Edge triggered pulse generator 301 generates a pulse of width 'Td' for every transition at its input.

It is apparent that delay element D31 can be realized in number of ways, from simple chain of inverters to more complex delay circuitry with process, temperature and voltage compensations.

Differential receiver in FIG. 7 propagates any change in logic state of differential input signals at PAD/PADbar to the output OUT3. Transition at OUT3 triggers edge triggered pulse generator 301 to generate a positive pulse of period 'Td'. The positive pulse will switch off the PMOS P33, blocking current Ibias. The blocking of current Ibias extremely reduces the current through current sink NMOS N33 and therefore extremely reduces the bandwidth of the differential receiver. (NMOS N33 will operate in its subthreshold region, allowing current of the order of few microamperes).

So, once the receiver detects the input transitions, the bandwidth of the receiver is extremely reduced for predetermined period of time 'Td'. For this period of time the receiver rejects any noise disturbances at the input and power dissipation is lowered. Also, since during input transitions its current and bandwidth remains high, the high speed performance of the receiver remains unaffected.

It is to be noted that pulse period 'Td' is kept less than the minimum time interval between two consecutive transitions which possibly could arrive at the input of receiver. Also, output OUT3 of the receiver can be latched for the time when Ibias is blocked.

In the circuit according to a first embodiment of the invention shown in FIG. 7, ideally it is desired that current Ibias should be blocked immediately after the differential input transitions appears at the output OUT3. But in this case the delay of the edge triggered pulse generator 301 is added between a transition at output OUT3 and blocking of current Ibias.

Figure 8:
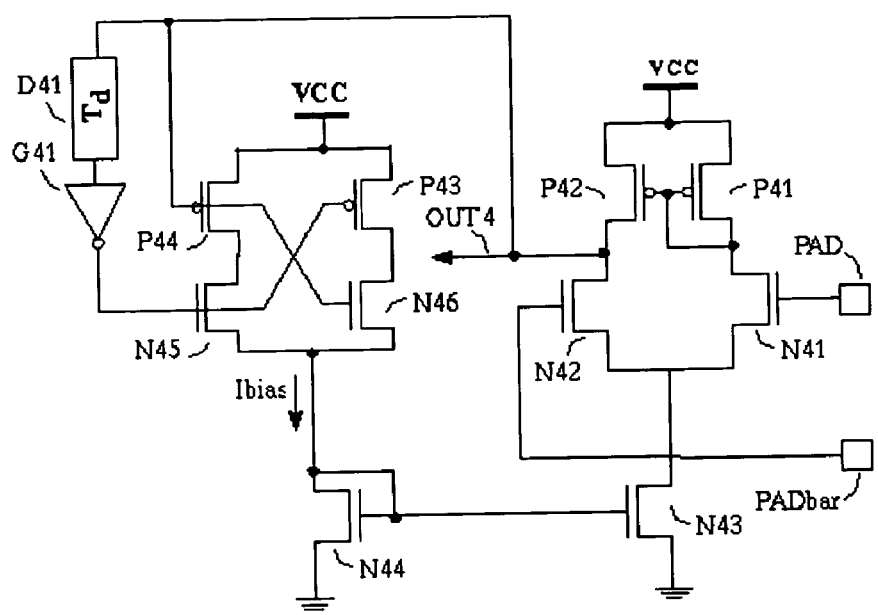
FIG. 8 illustrates circuit diagram of a differential receiver according to a second embodiment of the invention.

FIG. 8 shows circuit diagram of a differential receiver according to a second embodiment of the invention. In this embodiment the delay between the transition at the output of the receiver and the blocking of the current Ibias is reduced by removing the edge triggered pulse generator circuitry 301 and instead implementing substantially the same functionality within the current mirror itself. In FIG. 8, adding series connected PMOS P44 and NMOS N45 in parallel with another series connected PMOS P43 and NMOS N46 in the Ibias current path modifies the current mirror circuitry. The gates of PMOS P44 and NMOS N46 are controlled directly by the output OUT4 of the differential receiver, while the gates of PMOS P43 and NMOS N45 are controlled by a delayed-inverted version of signal at OUT4. The delay element D41 provides a delay of time 'Td'. The rest of the circuitry is similar to that of the first embodiment.

In FIG. 8 it can be seen that there are two parallel paths for bias current Ibias. One through PMOS P44 and NMOS N45 and other through PMOS P43 and NMOS N46. In steady state one of the two parallel paths is open and other is closed, thus allowing current Ibias to flow. During transitions at output OUT4 both the paths get open for predetermined period of time 'Td'. So, for this period of time the current Ibias is blocked. It is to be noted that the resistance provided by both of the paths, when conducting, is exactly equal.

To understand the operation of the circuitry shown in FIG. 8, we consider a steady state condition with output OUT4 at logic low. For this state PMOS P44 and NMOS N45 will be on and PMOS P43 and NMOS N46 will be off. So in this case the path through P44 and N45 will be closed allowing current Ibias. The path through P43 and N46 will remain open. Now when output OUT4 transitions from logic low to logic high, P44 turns off immediately, opening the path through P44 and N45. As PMOS P43 remains off because of the delay 'Td', current Ibias is blocked. At the same time NMOS N46 is switched 'on' for low to high transition at OUT4. After a time delay 'Td' PMOS P43 also turns on, closing the path through P43 and N46. Thus current Ibais, which is blocked for predetermined period of time 'Td', is again allowed to flow. Now when output OUT4 again transitions from logic high to logic low, the same process is followed with NMOS N46 turning off immediately and NMOS N45 turning on after a delay of 'Td'.

Figure 1:
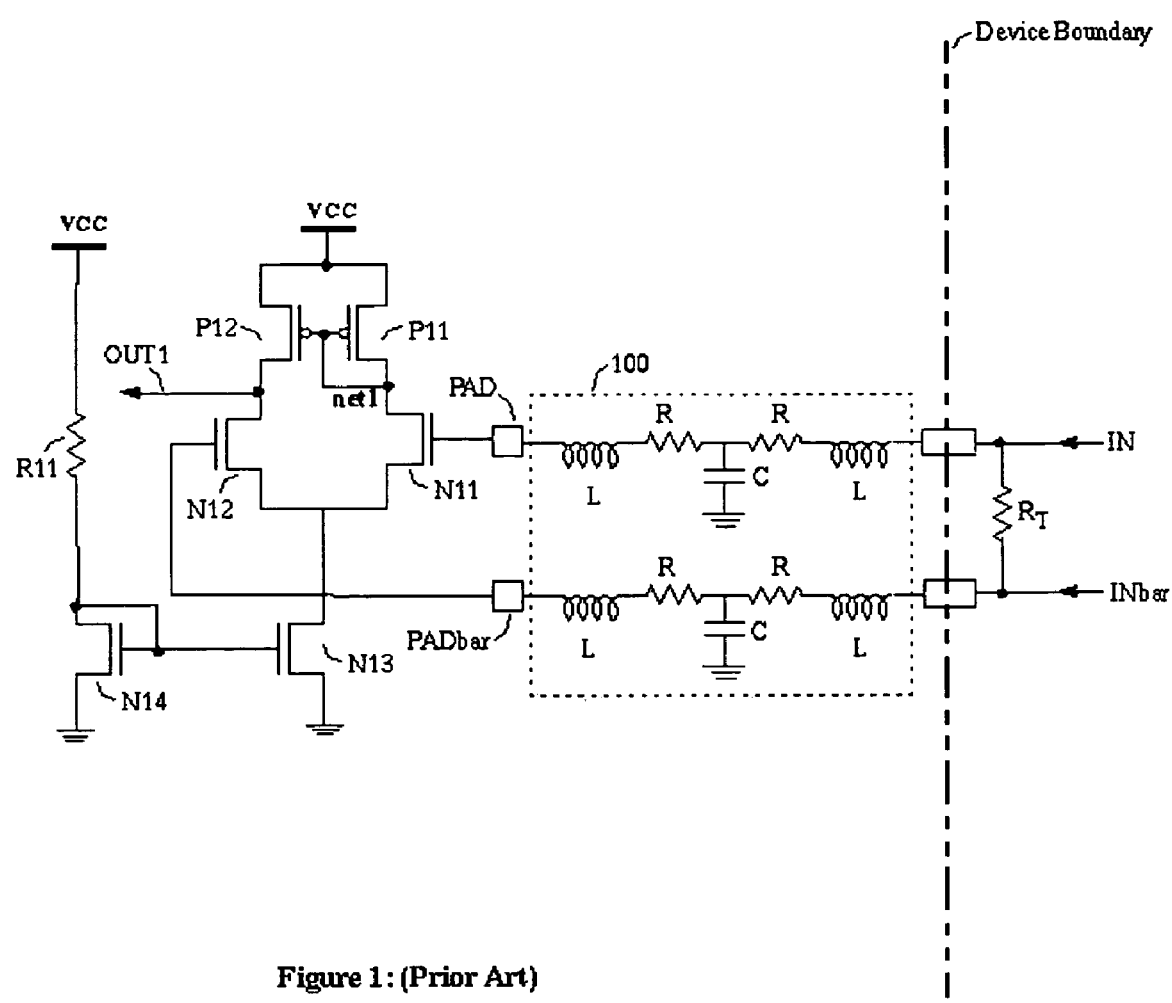
FIG. 1 illustrates the schematic of a conventional differential receiver circuit.
Figure 2:
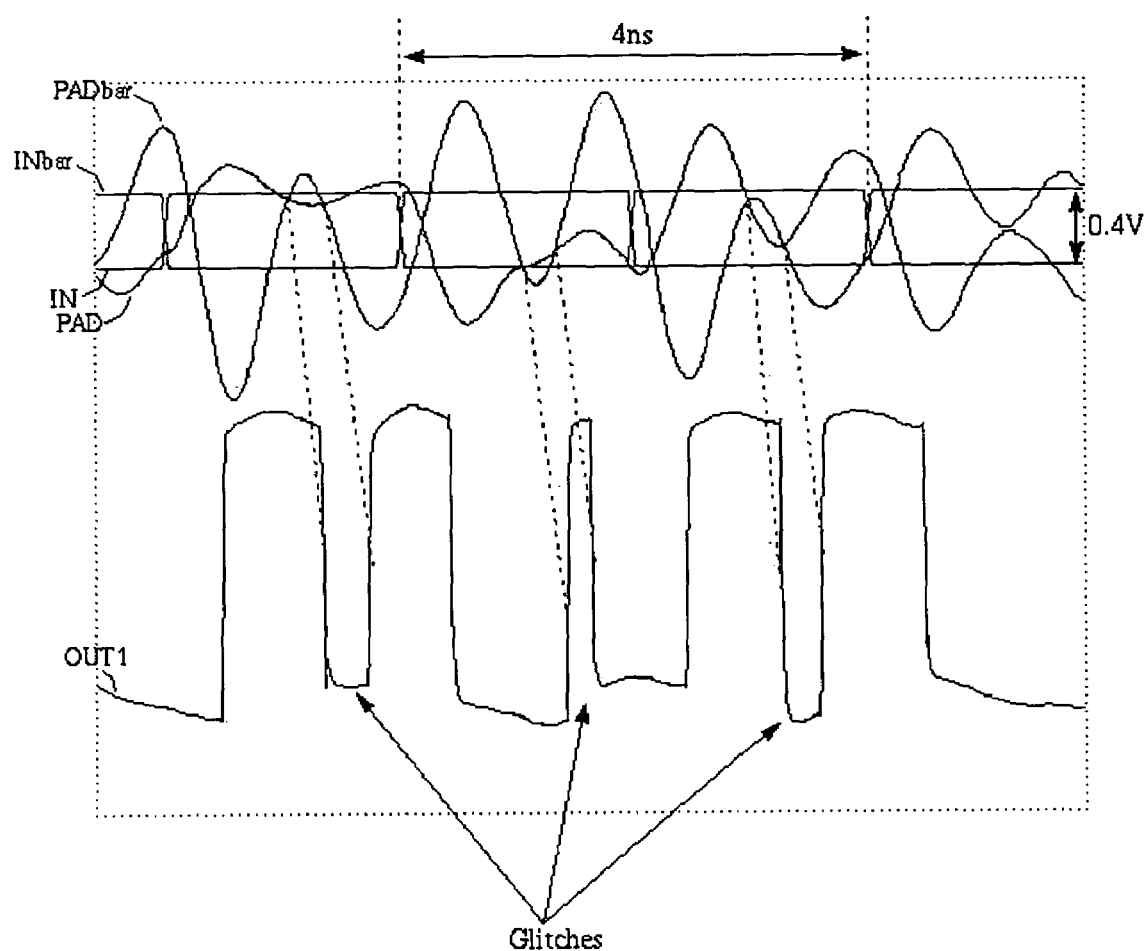
FIG. 2 illustrates the HSpice post-layout simulation results of prior art receiver in FIG. 1.
Figure 3:
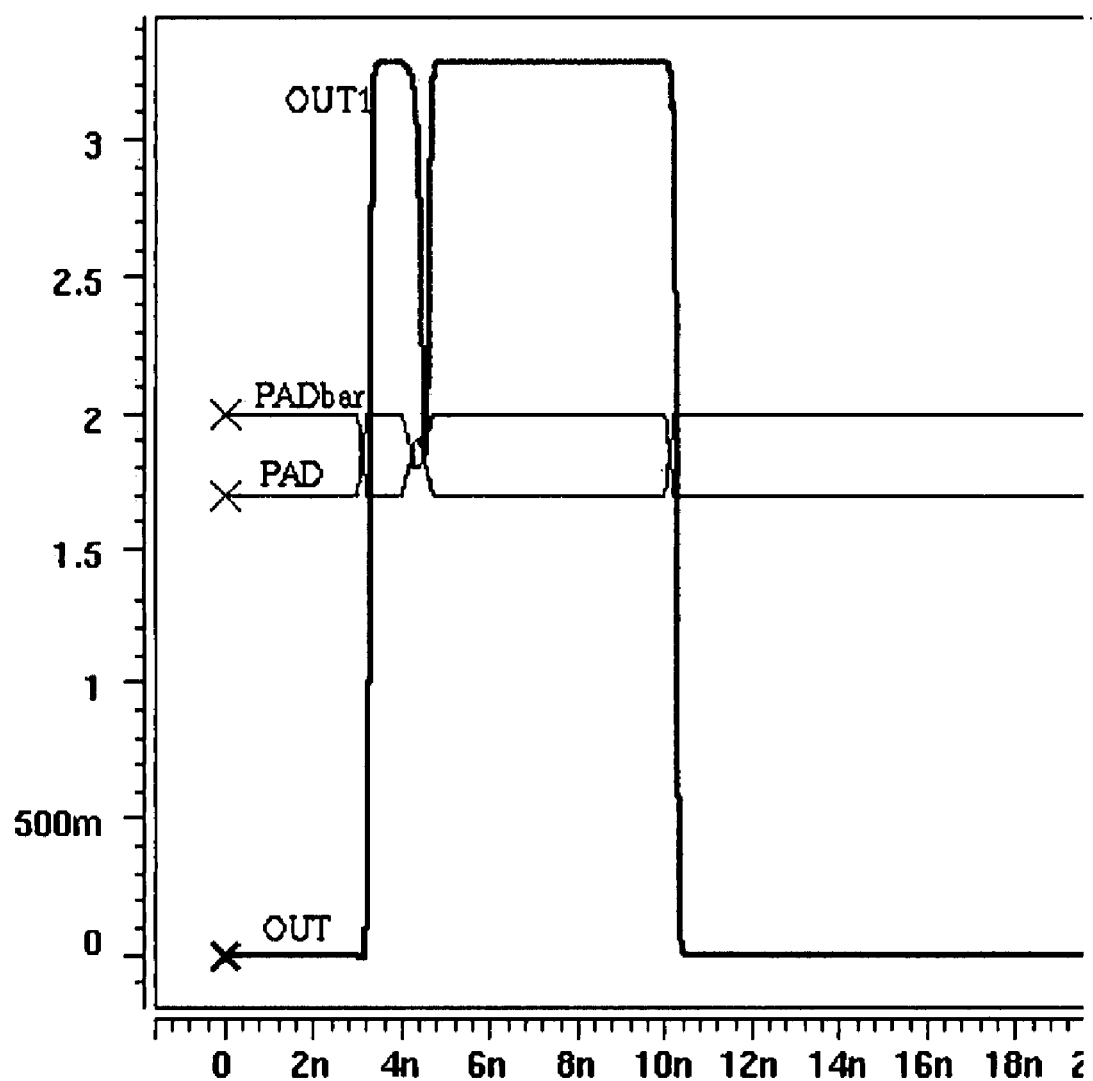
FIG. 3 shows the simulation results of FIG. 1 with noisy input at PAD and PAD bar.
Figure 9:
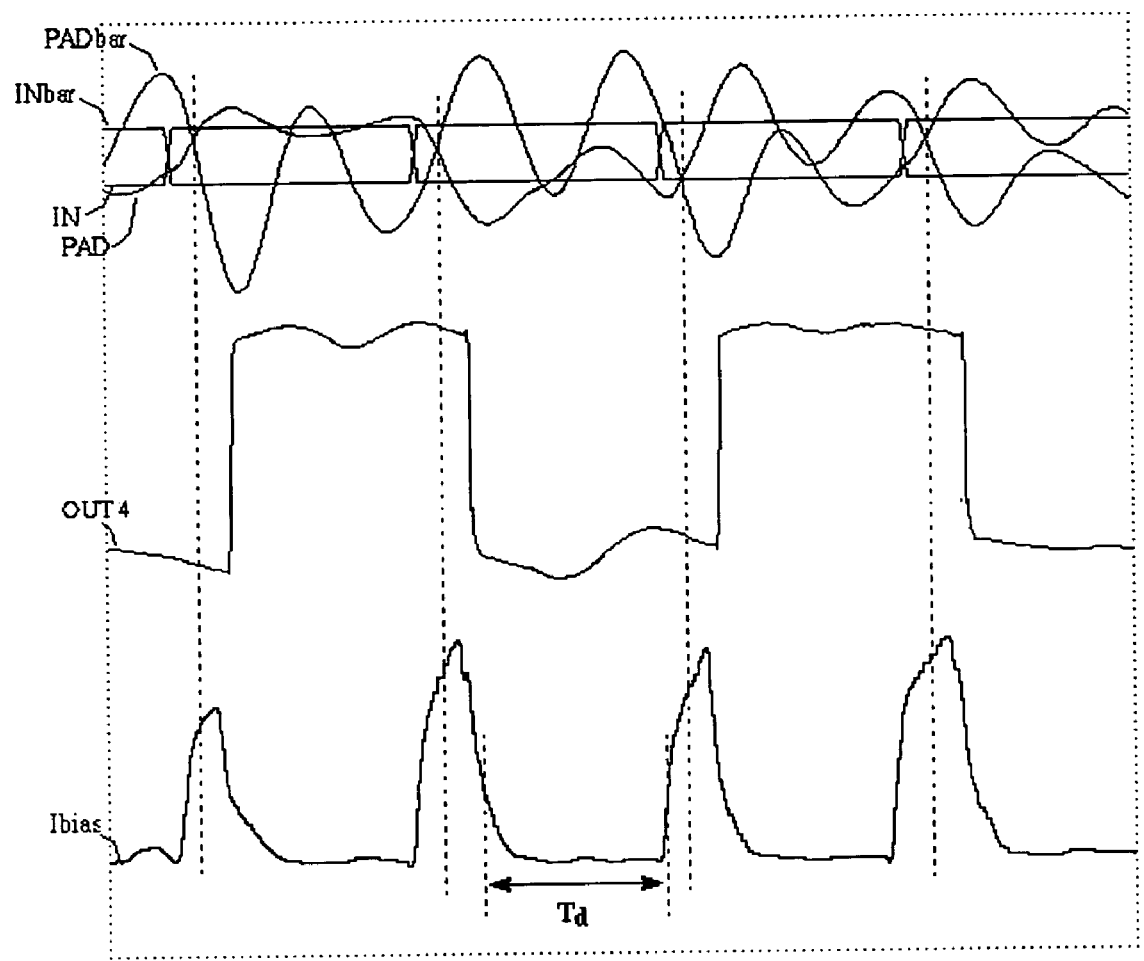
FIG. 9 shows HSpice post-layout simulation results of differential receiver in FIG. 7.

FIG. 9 shows HSpice post-layout simulation results of the differential receiver in FIG. 7 with the same package parasitic as that in FIG. 1 (package parasitic not shown in FIG. 7 but connected exactly similar to that in FIG. 1). In FIG. 9, IN and INbar are the differential input signals applied having time period of 4 ns and signal swing of 0.4V (pins IN and INbar are not shown in FIG. 4). PAD and PADbar are the actual input waveforms looked by the differential receiver. OUT4 is the output of the differential receiver according to second embodiment of the invention. Waveform of current Ibais is also shown in FIG. 9. It can be seen that although noise still persist there are no more glitches on output signal OUT4. It is also to be observed that current Ibias is blocked for time 'Td' immediately after the output OUT4 transitions and remains high during the transitions of differential input signals.

It seems that the solution is time dependent and will effectively lock noise and glitches for some predetermined period of time and when this period of time is exhausted, any additional noise or glitch will still be propagated through. But in the case of differential signals, as explained earlier in background of invention section, the majority of noise problem comes at the time of transitions.

The cause of false transitions and glitches in differential receivers is differential noise, which is mainly in aftermath of transitions and remains for sometime after the transitions. In the present invention this differential noise is locked for predetermined period of time Td by blocking current Ibias just after the input transitions. When this period of time 'Td' is exhausted and inputs are stable (not transitioning), noise coupling to the differential pair will be common mode noise which may have a differential residue due to unequal distance from aggressor, unbalance in the differential transmission line, unbalance source and load impedance. But with good up front floor planning of board layouts, this differential residue can be made very small and thus harmless.

Figure 10:
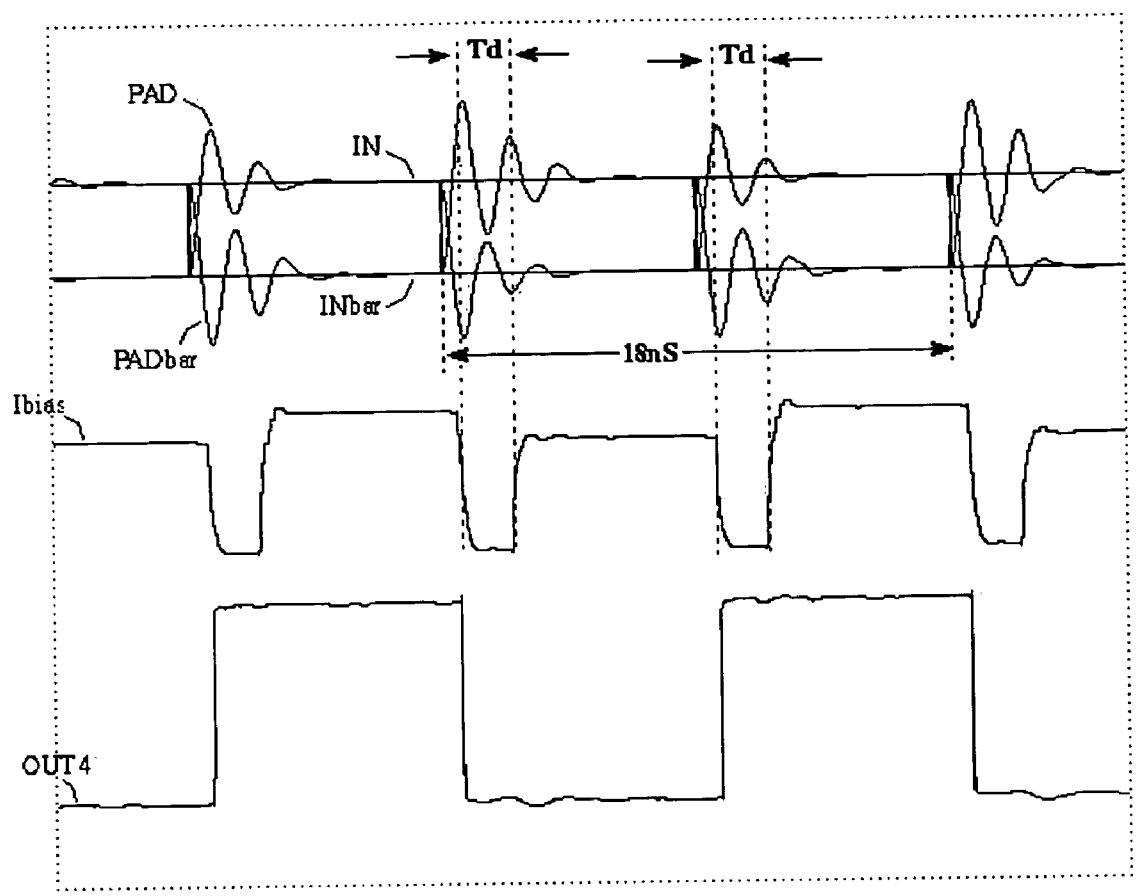
FIG. 10 shows simulation results of differential receiver of FIG. 7 applied with differential input signals with larger time-period.

FIG. 10 shows simulation results of differential receiver of FIG. 7, applied with differential input signals with larger time-period. Here 18 ns time period is taken in order to explain that differential noise remains only for sometimes after the transitions. After that even if time 'Td' is exhausted and receiver regains high bandwidth and current, chances of any glitch to appear are negligible because now whatever noise couples will be mainly weak differential residue of common mode noise.

It can be seen in FIG. 10 that differential noise, caused due to transitions, is blocked for the time it is dangerous, and until the time 'Td' is exhausted, it has effectively damped out.

Figure 11:
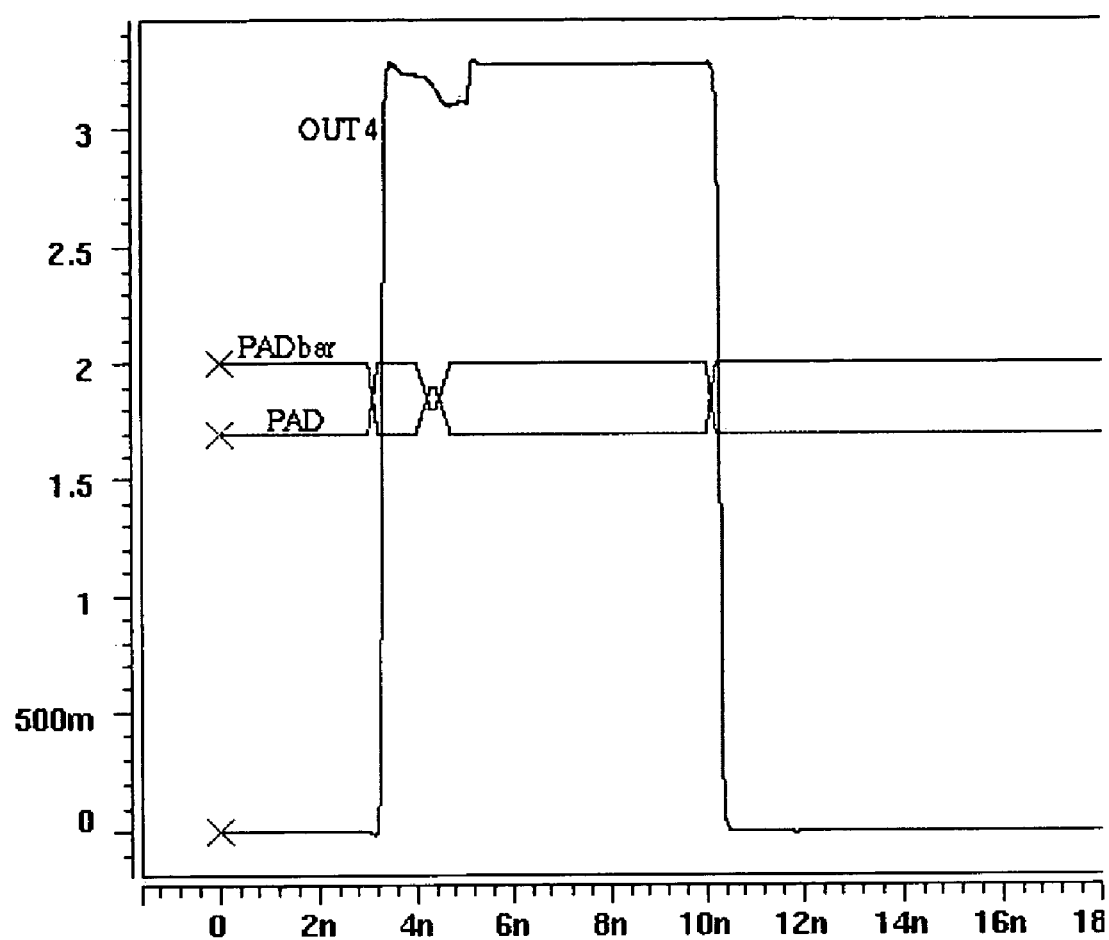
FIG. 11 shows the output waveform of the present invention of FIG. 7.

FIG. 11 shows the output waveform of the present invention of FIG. 7. It can be observed from the figure that the same amount of noise is rejected at the output OUT4, without increasing the propagation delay of the receiver.

The table given below illustrates the comparative simulation results of the prior art and the present invention.

Figure 4:
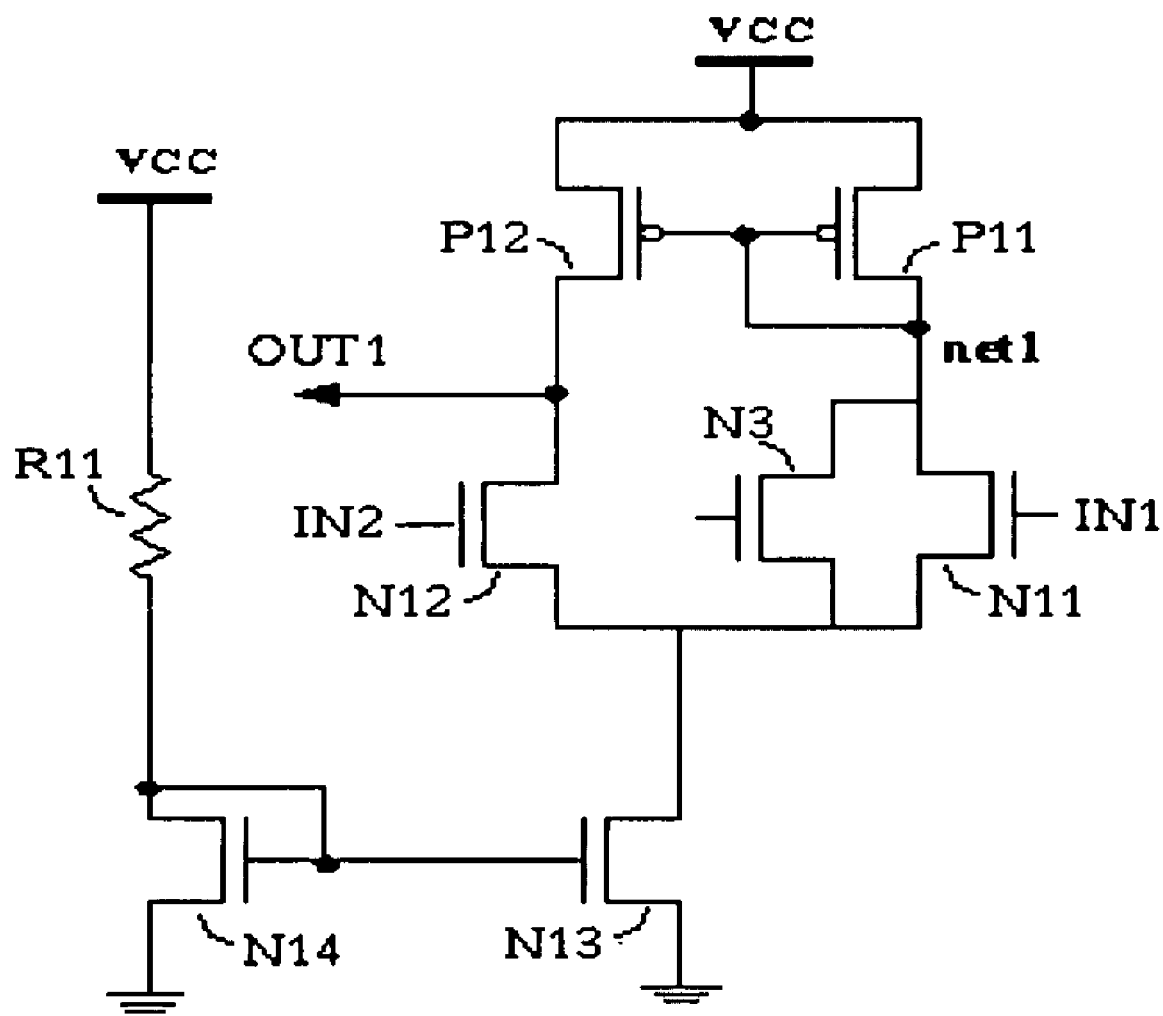
FIG. 4 illustrates a prior art differential receiver with hysteresis as suggested in U.S. Pat. No. 5,796,281.
Figure 5:
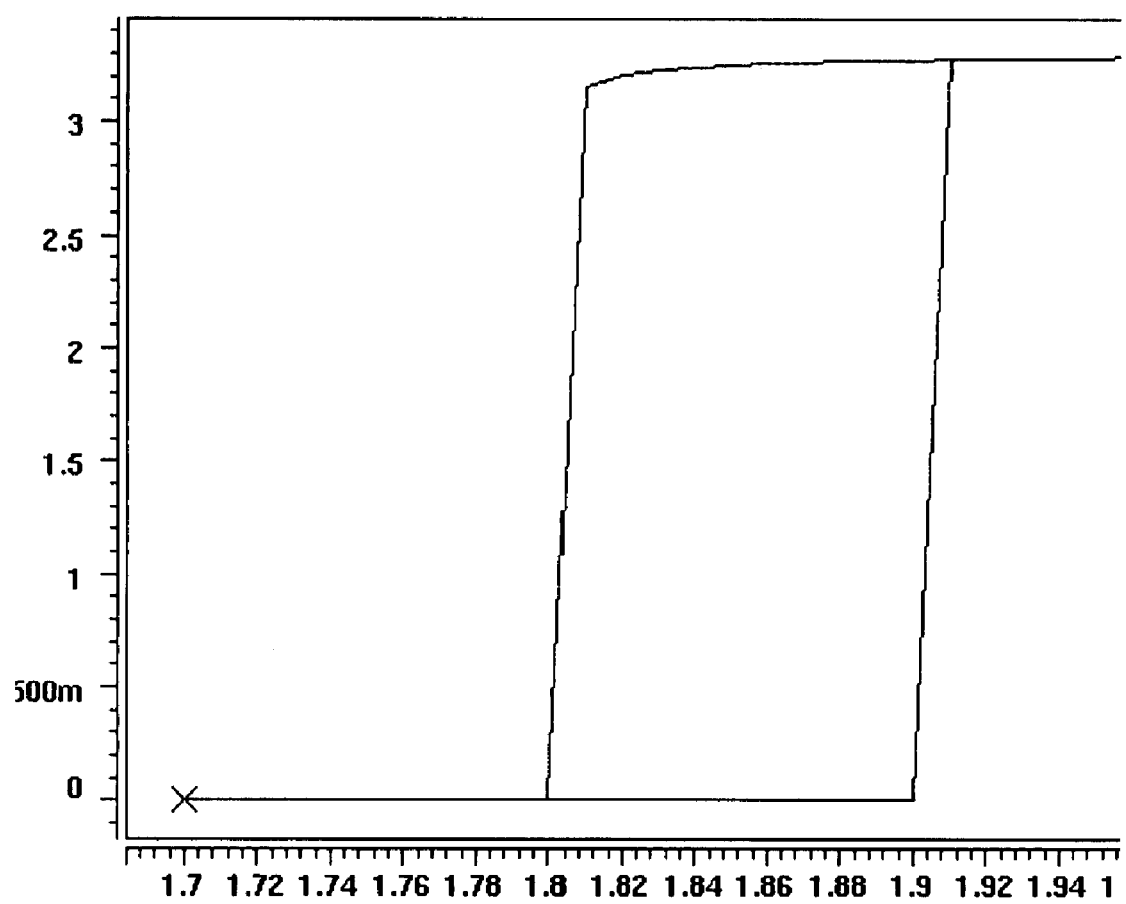
FIG. 5 shows the dc analysis result of FIG. 4;.
Figure 6:
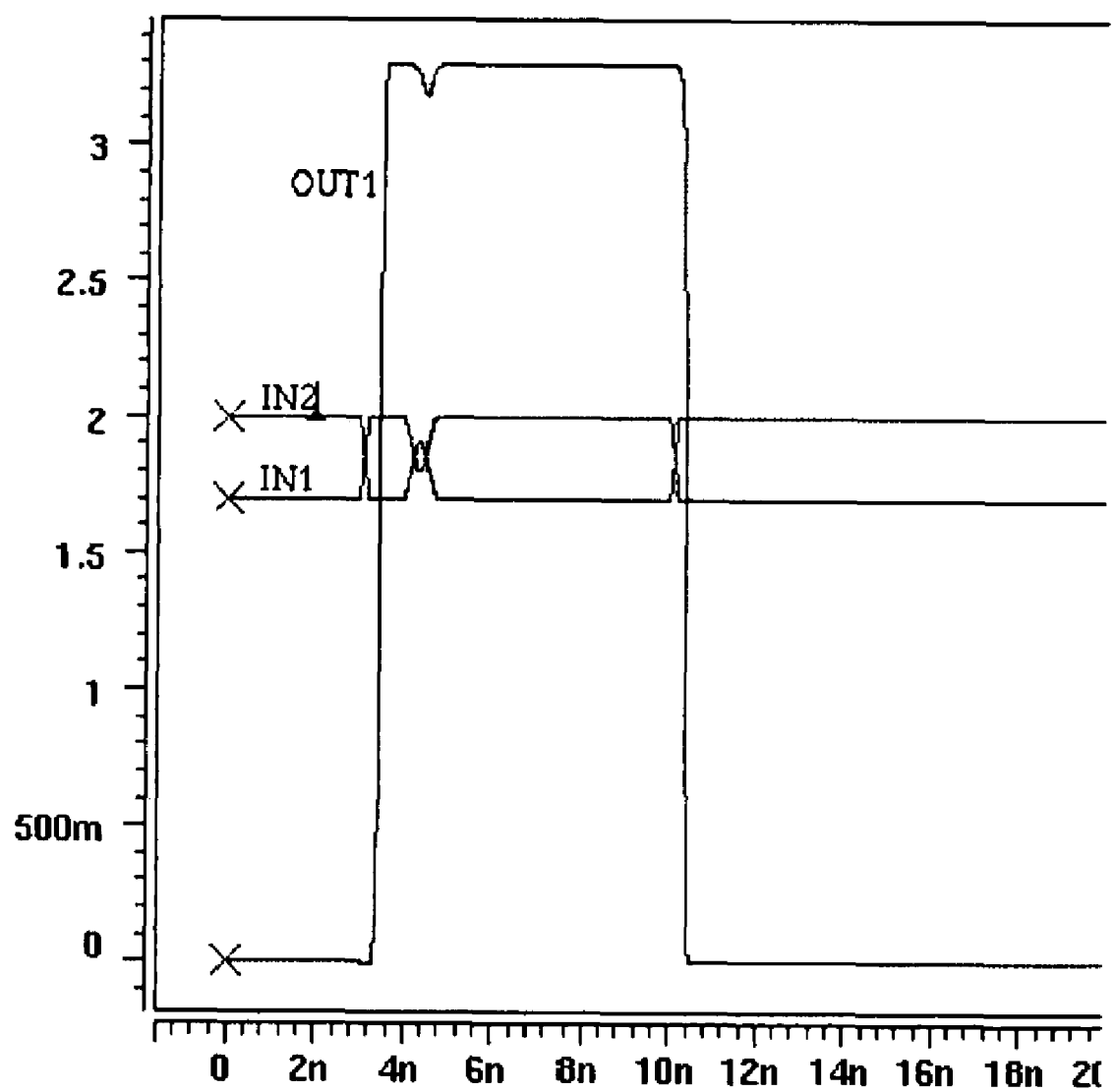
FIG. 6 shows the transient analysis results of FIG. 4.

| Circuit implemented | Rising delay | Falling delay | Power Dissipation | Whether glitch comes |
|---|---|---|---|---|
| FIG. 1 (Without any noise protection circuit) | 0.207 ns | 0.183 ns | 19.38 mW | YES |
| FIG. 4 (With hysteresis) | 0.354 ns | 0.254 ns | 18.32 mW | NO |
| FIG. 7 (Present Invention) | 0.207 ns | 0.183 ns | 15.70 mW | NO |

Thus we can say that the instant invention provides a noise protection circuit with reduced delays and minimized power dissipation.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A differential receiver, comprising:
   a differential circuit having a differential output node and at least one common node; and
   a feedback circuit connected to receive a signal from the differential output node and generate a feedback signal in response thereto, the feedback circuit connected to control the at least one common node so as to reduce receiver bandwidth and reject noise for a specific interval of time.

2. The differential receiver in claim 1, wherein said feedback circuit comprises a pulse generator circuit, an output of said pulse generator circuit being connected to a control bias current circuit and a current mirror circuit coupled in series.

3. The differential receiver in claim 2, wherein said pulse generator circuit comprises a delay element and a logic gate, and an output of said delay element is connected to an input of said logic gate.

4. The differential receiver in claim 3, wherein said logic gate is an Ex-OR gate.

5. The differential receiver in claim 3, wherein said logic gate is an inverter.

6. The differential receiver in claim 3, wherein said delay element is one of a chain of inverters or a complex delay circuitry.

7. The differential receiver in claim 2, wherein said control bias current circuit comprises at least one transistor powered by a higher voltage supply.

8. The differential receiver in claim 2, wherein said current mirror circuit comprises at least two transistors connected to each other at their control nodes.

9. The differential receiver in claim 8, wherein said transistors are either P-MOS or N-MOS transistors.

10. A differential receiver, comprising:
a pair of differential input transistors coupled at a common node and whose gates receive a differential input signal;
a pair of load transistors coupled to the pair of differential input transistors to form at least one differential output node;
a current sink circuit coupled to the common node of the pair of differential input transistors; and
a feedback circuit coupled to receive an output signal from the differential output node and apply a feedback signal to the current sink circuit in response to the output signals,
wherein the feedback circuit comprises a time delay circuit having an output and an input coupled to the differential output node and a logic circuit having an input coupled to the output of the time delay circuit and an output coupled to the current sink circuit.

11. The differential receiver of claim 10 wherein the logic circuit is a NOT gate.

12. The differential receiver of claim 10 wherein the logic circuit is an EX-OR gate having a first input coupled to the output of the time delay circuit and a second input coupled to the differential output node.

13. A differential receiver, comprising:
a pair of differential input transistors coupled at a common node and whose aates receive a differential input signal;
a pair of load transistors coupled to the pair of differential input transistors to form at least one differential output node;
a current sink circuit coupled to the common node of the pair of differential input transistors; and
a feedback circuit coupled to receive an output signal from the differential output node and apply a feedback signal to the current sink circuit in response to the output signal;
wherein the current sink circuit comprises a current mirror circuit having a mirror branch coupled to the common node and a reference branch whose current is controlled by the feedback circuit.

14. The differential receiver of claim 13 wherein the reference branch includes a transistor whose gate terminal is coupled to an output of the feedback circuit.

15. The differential receiver of claim 14 wherein the feedback circuit turns the reference branch on during a steady-state mode with respect to the differential output node and turns the reference branch off in response to a transition mode with respect to the output signal of the differential output node.

16. The differential receiver of claim 15 wherein the feedback circuit includes a delay timing circuit for setting a certain amount of time that the reference branch is turned off in response to a transition mode with respect to the output signal of the differential output node.

17. The differential receiver of claim 13 wherein the reference branch includes a first sub-branch and a second sub-branch whose operations are controlled by the feedback circuit.

18. The differential receiver of claim 17 wherein the feedback circuit turns one or the other of the first and second sub-branches on during a steady-state mode with respect to the output signal of the differential output node and turns both of the first and second sub-branches off in response to a transition mode with respect to the output signal of the differential output node.

19. The differential receiver of claim 18 wherein the feedback circuit includes a delay timing circuit for setting an certain amount of time that both of the first and second sub-branches are turned off in response to a transition mode with respect to the output signal of the differential output node.

20. A method, comprising:
differentially receiving a signal to generate an output signal at a differential output of a differential receiver; and
controlling differential receiver bias current responsive to the output signal wherein controlling comprises:
turning bias current on during a steady-state mode with respect to the output signal; and
turning bias current off in response to a transition mode with respect to the output signal.

21. The method of claim 20 wherein turning bias current off comprises limiting an amount of time bias current is turned off to a certain delay period.

22. A method for rejecting noise signals by a differential receiver comprising:
detecting an input signal by the differential receiver; and
outputting a response from the differential receiver to a feedback circuit for reducing a current flowing through the differential receiver and thereby reducing a bandwidth of the differential receiver in order to reject noise for a specific interval of time.

* * * * *

UNITED STATES PATENT AND TRADEMARK OFFICE
CERTIFICATE OF CORRECTION

PATENT NO. : 7,348,802 B2
APPLICATION NO. : 11/152822
DATED : March 25, 2008
INVENTOR(S) : Sunil Chandra Kasanyal et al.

It is certified that error appears in the above-identified patent and that said Letters Patent is hereby corrected as shown below:

At column 7, claim number 10, line number 40, replace [signals] with -- signal --.

At column 7, claim number 13, line number 54, replace [aates] with -- gates --.

Signed and Sealed this
Tenth Day of April, 2012

David J. Kappos
*Director of the United States Patent and Trademark Office*